(12) United States Patent  
Muramoto

(10) Patent No.: US 8,395,179 B2
(45) Date of Patent: Mar. 12, 2013

(54) SEMICONDUCTOR LIGHT EMITTING ELEMENT AND METHOD FOR MANUFACTURING SAME

(75) Inventor: Eiji Muramoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 12/878,978

(22) Filed: Sep. 9, 2010

(65) Prior Publication Data

US 2011/0220928 A1    Sep. 15, 2011

(30) Foreign Application Priority Data

Mar. 11, 2010    (JP) ................................. 2010-055029

(51) Int. Cl.
*H01L 33/00* (2010.01)

(52) U.S. Cl. ..................... 257/99; 257/98; 257/E33.068; 438/29

(58) Field of Classification Search ..................... 257/99; 438/29

See application file for complete search history.

(56) References Cited

U.S. PATENT DOCUMENTS

| | | | |
|---|---|---|---|
| 7,511,311 B2* | 3/2009 | Kususe et al. | 257/95 |
| 7,737,455 B2* | 6/2010 | Shum | 257/98 |
| 7,964,884 B2* | 6/2011 | Lee | 257/98 |
| 7,968,355 B2* | 6/2011 | Kim | 438/22 |
| 2010/0032701 A1 | 2/2010 | Fudeta | |

FOREIGN PATENT DOCUMENTS

| | | |
|---|---|---|
| JP | 2009-099675 | 5/2009 |
| JP | 2010-027643 | 2/2010 |
| JP | 2010-040761 | 2/2010 |
| JP | 2011-009386 | 1/2011 |

OTHER PUBLICATIONS

Japanese Office Action dated Jan. 24, 2012, filed in Japanese counterpart Application No. 2010-055029, 13 pages (with English translation).

* cited by examiner

*Primary Examiner* — Jerome Jackson, Jr.
(74) *Attorney, Agent, or Firm* — Patterson & Sheridan, LLP

(57) ABSTRACT

According to one embodiment, a semiconductor light emitting element includes a stacked body, a first and second electrode, a support substrate, a protective film and a dielectric film. The stacked body includes a first semiconductor, a second semiconductor layer and a light emitting portion. The first electrode is provided on a first major surface of the stacked body. The second electrode is provided on a second major surface of the stacked body. The support substrate is provided on the second major surface via a bonding metal. The protective film is provided on at least a side surface of the stacked body except the second major surface. The dielectric film is provided between the bonding metal and a region of the second major surface not provided with the second electrode, and between the bonding metal and a surface of the protective film on the second major surface side.

19 Claims, 12 Drawing Sheets

2

SEMICONDUCTOR LIGHT EMITTING ELEMENT AND METHOD FOR MANUFACTURING SAME

CROSS-REFERENCE TO RELATED APPLICATIONS

This application is based upon and claims the benefit of priority from the prior Japanese Patent Application No. 2010-055029, filed on Mar. 11, 2010; the entire contents of which are incorporated herein by reference.

FIELD

Embodiments described herein relate generally to a semiconductor light emitting element and a method for manufacturing the same.

BACKGROUND

In a recent technique used for manufacturing semiconductor light emitting elements such as LED (light emitting diode), a stacked body including a light emitting portion is formed on a sapphire or other growth substrate. This manufacturing method is performed in the following procedure. On a substrate made of e.g. sapphire, a stacked body including a light emitting portion is grown. Next, a conductive substrate is bonded to a major surface of the stacked body on the opposite side from this growth substrate. Subsequently, the growth substrate is removed from the stacked body. Then, an electrode is formed on the surface of the stacked body exposed by the removal of the growth substrate. Another electrode is formed on the conductive substrate.

With regard to the above process, a laser lift-off method has been proposed as a method for removing the growth substrate from the stacked body. However, after removing the growth substrate, in the etching step for dividing the stacked body, the bonding metal for bonding the conductive substrate to the stacked body is exposed. This bonding metal, if scattered by partial peeling or overetching, may cause leak current.

DETAILED DESCRIPTION

Figure 1:
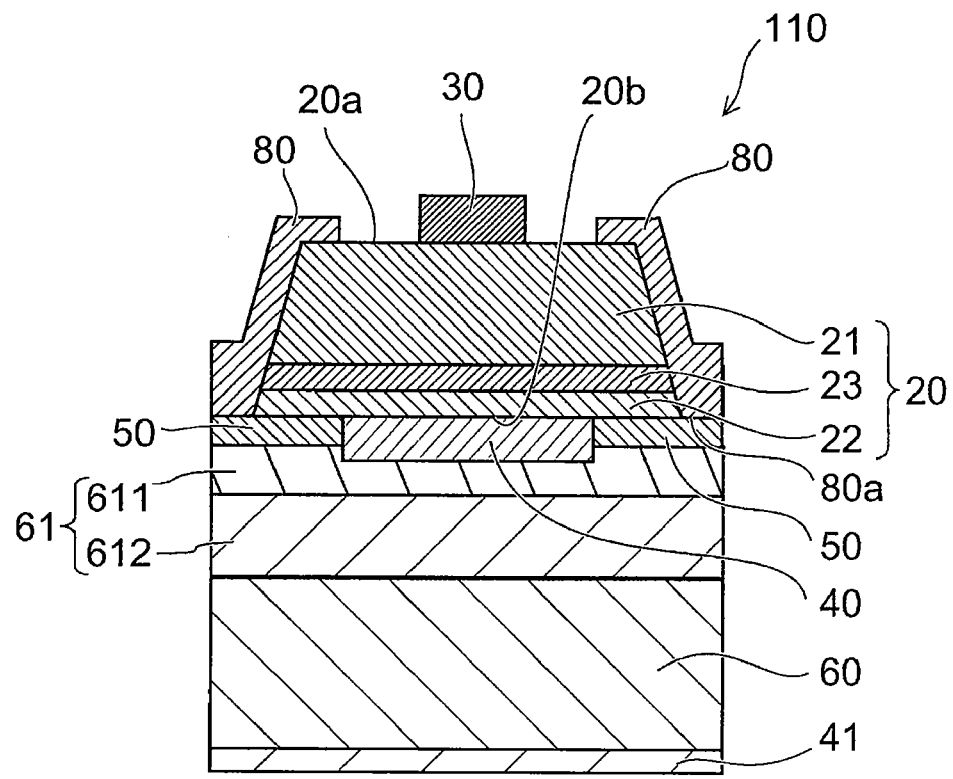
FIG. 1 is a schematic cross-sectional view illustrating a semiconductor light emitting element according to a first embodiment.

In general, according to one embodiment, a semiconductor light emitting element includes a stacked body, a first electrode, a second electrode, a support substrate, a protective film and a dielectric film. The stacked body includes a first semiconductor layer of a first conductivity type, a second semiconductor layer of a second conductivity type, and a light emitting portion provided between the first semiconductor layer and the second semiconductor layer. The first electrode is selectively provided on a first major surface of the stacked body. The second electrode is selectively provided on a second major surface of the stacked body on an opposite side from the first major surface. The support substrate is provided on the second major surface side of the stacked body via a bonding metal. The protective film is provided on at least a side surface of the stacked body except the second major surface. The dielectric film is provided between the bonding metal and a region of the second major surface not provided with the second electrode, and between the bonding metal and a surface of the protective film on the second major surface side.

According to another embodiment, a method for manufacturing a semiconductor light emitting element is disclosed. The method can include forming a stacked body including a first semiconductor layer of a first conductivity type, a light emitting portion, and a second semiconductor layer of a second conductivity type on a first substrate. The method can include forming a dielectric film on a second major surface of the stacked body on an opposite side from the first substrate. The method can include exposing the stacked body by selectively removing the dielectric film, and forming a second electrode on an exposed surface of the stacked body. The method can include forming a metal layer on the second electrode to bond a second substrate via the metal layer. The method can include peeling the first substrate from the stacked body by irradiation with laser light to a surface on an opposite side of the first substrate to the second substrate. The method can include selectively removing the stacked body from the second major surface side to a position just before the dielectric film. In addition, the method can include forming a first electrode on a first major surface of the stacked body on an opposite side from the second major surface.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and the drawings, the same components as those described previously with reference to earlier figures are labeled with like reference numerals, and the detailed description thereof is omitted as appropriate.

First Embodiment

FIG. 1 is a schematic cross-sectional view illustrating a semiconductor light emitting element 110 according to a first embodiment.

As shown in FIG. 1, the semiconductor light emitting element 110 according to the first embodiment includes a stacked body 20, a first electrode 30 selectively provided on a first major surface 20a of the stacked body 20, a second electrode 40 selectively provided on a second major surface 20b of the stacked body 20 on the opposite side from the first major surface 20a, a support substrate 60 provided on the second electrode 40 side and bonded via a bonding metal 61, a protective film 80 provided on at least a side surface 20c of the stacked body 20 except the second major surface 20b, and a dielectric film 50 provided between the bonding metal 61 and a region of the second major surface 20b not provided with the second electrode 40, and between the bonding metal 61 and a surface (protective major surface 80a) of the protective film 80 on the second major surface 20b side.

The semiconductor light emitting element 110 is illustratively an LED (light emitting diode).

The stacked body 20 includes a first semiconductor layer 21 of a first conductivity type, a second semiconductor layer 22 of a second conductivity type, and a light emitting portion 23 provided between the first semiconductor layer 21 and the second semiconductor layer 22. In the description of this embodiment, it is assumed that the first conductivity type is n-type and the second conductivity type is p-type.

The dielectric film 50 is illustratively made of silicon oxide, silicon nitride, and titanium oxide. The dielectric film 50 can be a single layer film made of one selected from these materials, or a multilayer film with a plurality of films of different refractive indices stacked therein.

The dielectric film 50 is used as a stopper film when the stacked body 20 is etched in the process for manufacturing the semiconductor light emitting element 110 described later.

If the dielectric film 50 is used as a stopper film, then in etching the stacked body 20, the bonding metal 61 underlying the dielectric film 50 is covered with the dielectric film 50. That is, the dielectric film 50 covers the bonding metal 61 during the manufacturing process and prevents the bonding metal 61 from being partly peeled. Furthermore, even if overetching occurs in etching the stacked body 20, the dielectric film 50 prevents the bonding metal 61 from being etched. This eliminates scattering of the bonding metal 61 into dust by overetching. Thus, in the semiconductor light emitting element 110, the occurrence of leak current resulting from the bonding metal 61 is suppressed.

Furthermore, the dielectric film 50 is used as a reflective film for reflecting light emitted from the light emitting portion 23 of the stacked body 20. That is, at the wavelength of the light (emission light) emitted from the light emitting portion 23, the dielectric film 50 has a higher reflectance than the bonding metal 61.

Figure 2:
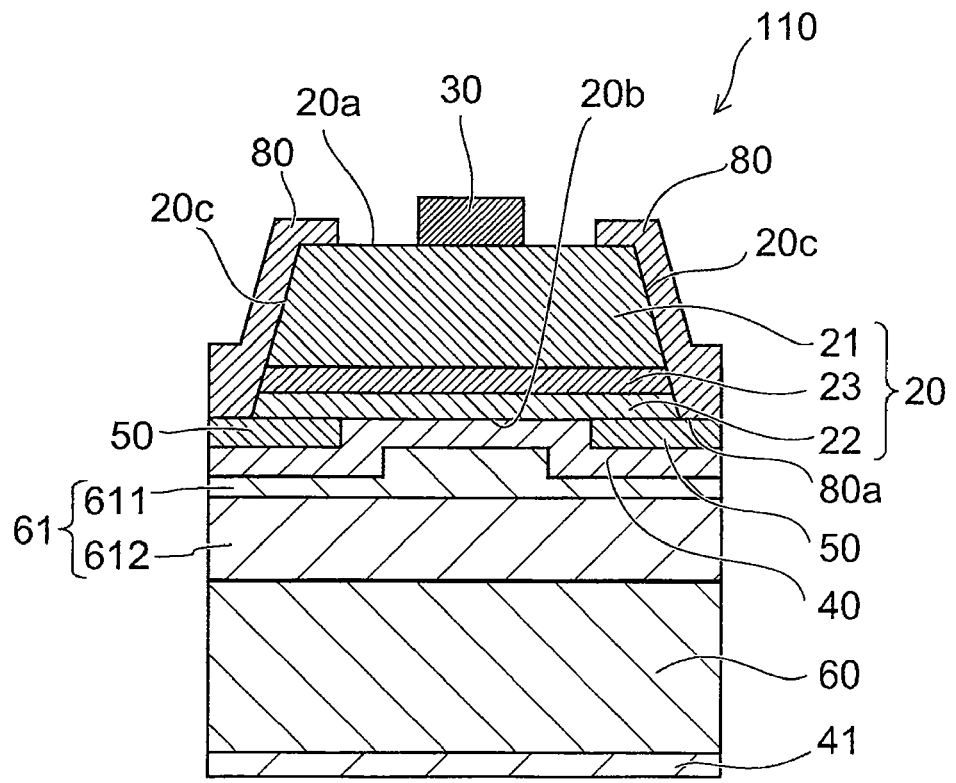
FIG. 2 is a schematic cross-sectional view illustrating a semiconductor light emitting element including an alternative second electrode.

The second electrode 40 in the semiconductor light emitting element 110 may also be configured as shown in FIG. 2.

FIG. 2 is a schematic cross-sectional view illustrating a semiconductor light emitting element including an alternative second electrode.

In the semiconductor light emitting element 110 shown in FIG. 2, the second electrode 40 is formed on the entire surface. More specifically, while the second electrode 40 of the semiconductor light emitting element 110 shown in FIG. 1 is patterned, the second electrode 40 of the semiconductor light emitting element 110 shown in FIG. 2 is not patterned. Thus, on the second major surface 20b side of the stacked body 20, the second electrode 40 shown in FIG. 2 is formed on the region from part of the second major surface 20b to the dielectric film 50.

Use of such a second electrode 40 eliminates the need of the step for patterning the second electrode 40. Thus, the manufacturing process is simplified. Furthermore, the flatness of the second electrode 40 is improved, and adhesion of the bonding metal 61 can be improved.

Next, a specific example of the semiconductor light emitting element 110 is described.

The first semiconductor layer 21 and the second semiconductor layer 22 of the stacked body 20 illustratively include a nitride semiconductor.

The light emitting portion 23 illustratively has a multiple quantum well (MQW) structure. That is, the light emitting portion 23 includes a structure in which a plurality of barrier layers and a plurality of well layers are alternately and repeatedly stacked. Alternatively, the light emitting portion 23 may have a single quantum well (SQW) structure.

Furthermore, the stacked body 20 may include a superlattice structure, for instance, between the first semiconductor layer 21 and the light emitting portion 23. Such a structure allows the light emitting portion 23 to emit e.g. blue light or violet light.

The support substrate 60 supporting the stacked body 20 is illustratively a silicon substrate. The bonding metal 61 bonding the support substrate 60 to the second electrode 40 side of the stacked body 20 includes a first metal 611 provided on the second electrode 40 side and a second metal 612 provided on the support substrate 60 side.

The first metal 611 is illustratively a multilayer metal film of Ti/Pt/Au. In the first metal 611, the multilayer metal film is stacked in the order of Ti/Pt/Au from the second electrode 40 side. Ti improves adhesion to the second electrode 40, for instance. Pt functions as a barrier layer, for instance. Au functions as an adhesive to the second metal 612.

The second metal 612 is illustratively a multilayer metal film of Ti/Pt/Au/AuSn. In the second metal 612, the multilayer metal film is stacked in the order of Ti/Pt/Au/AuSn from the support substrate 60 side. Ti improves adhesion to the support substrate 60, for instance. Pt functions as a barrier layer, for instance. Au is used for thickness adjustment, for instance. AuSn improves bonding to the first metal 611, for instance.

The second electrode 40 is a p-side electrode.

Furthermore, the second electrode 40 functions as a reflective electrode. The second electrode 40 is illustratively a multilayer metal film of Ni/Ag. In the second electrode 40, the multilayer metal film is stacked in the order of Ni/Ag on the second major surface 20b of the stacked body 20. Ni improves adhesion to the second semiconductor layer 22 of the stacked body 20, for instance. Ag functions as a film for reflecting light emitted from the light emitting portion 23, for instance.

The first electrode 30 is an n-side electrode. The first electrode 30 is illustratively a multilayer metal film of Ti/Pt/Au. In the first electrode 30, the multilayer metal film is stacked in the order of Ti/Pt/Au on the first major surface 20a of the stacked body 20. Ti improves adhesion to the first semiconductor layer 21 of the stacked body 20, for instance. Pt functions as a barrier layer, for instance. Au improves adhesion to an external wiring, such as a bonding wire.

A protective film 80 is provided on the region from part of the first major surface 20a to the sidewall 20c of the stacked body 20. The protective film 80 serves to reduce leakage and to protect the semiconductor light emitting element 110, for instance.

Figure 3:
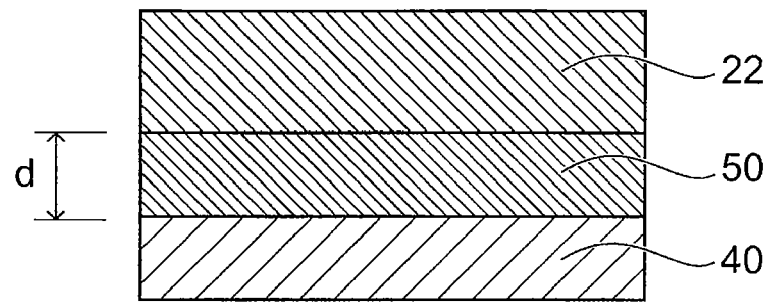
FIG. 3 is a schematic cross-sectional view illustrating the configuration of a dielectric film.

The dielectric film 50 is a single layer film or a multilayer film. FIG. 3 is an enlarged schematic view illustrating the second semiconductor layer 22 of the stacked body 20, the second electrode 40, and part of the dielectric film 50 located therebetween. Here, in the case where the dielectric film 50 is a single layer film, the film thickness d is configured to satisfy the following equation (1), for instance.

$$nd = m\lambda/4 \ (m = 1, 3, 5, \ldots) \tag{1}$$

In the above equation (1), n is the refractive index of the dielectric film 50, and λ is the wavelength of emission light. The dielectric film 50 having a film thickness d satisfying this equation (1) efficiently reflects emission light. Thus, the light extraction efficiency is improved in the semiconductor light emitting element 110.

For instance, in the case of using a single layer film of silicon oxide, an example of the film thickness d of the dielectric film 50 is as follows. Here, as a condition, the refractive index n of silicon oxide is 1.4. Furthermore, the second semiconductor layer 22 is made of GaN, which has a refractive index of 2.4. Furthermore, the second electrode 40 is made of Ag-based metal. Furthermore, the wavelength of emission light is 450 nm. Under this condition, from equation (1), the film thickness d of the dielectric film 50 is approximately 80 nm for m=1.

Comparative Example

Figure 4:
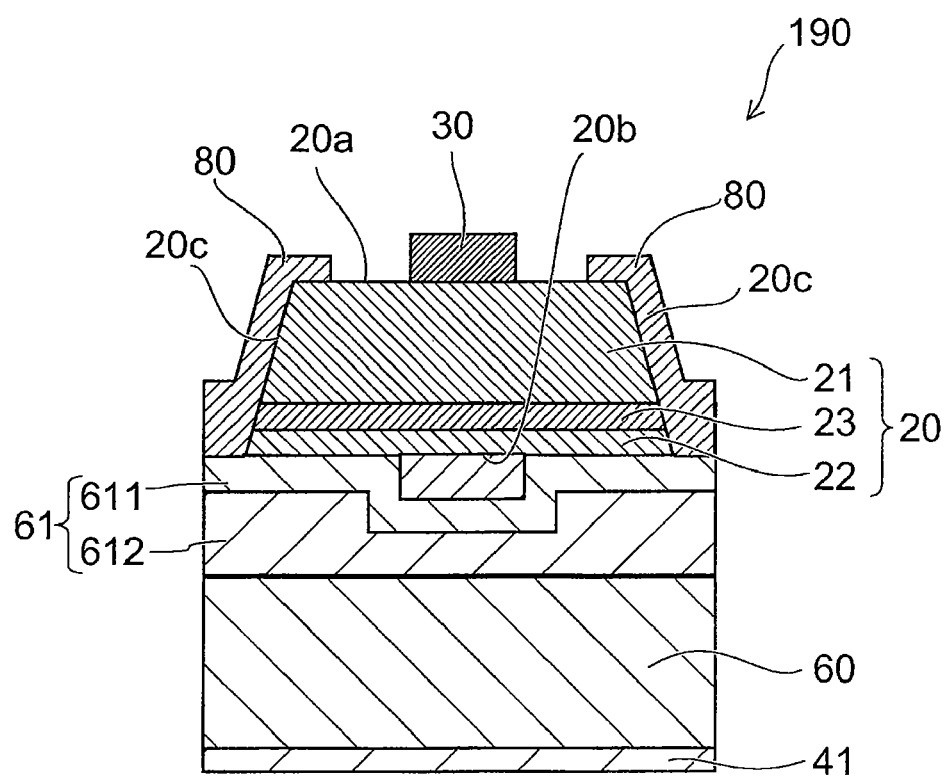
FIG. 4 is a schematic cross-sectional view illustrating a semiconductor light emitting element according to a comparative example.

FIG. 4 is a schematic cross-sectional view illustrating a semiconductor light emitting element 190 according to a comparative example.

The semiconductor light emitting element 190 according to the comparative example includes a stacked body 20, a first electrode 30 selectively provided on a first major surface 20a of the stacked body 20, a second electrode 40 selectively provided on a second major surface 20b of the stacked body 20 on the opposite side from the first major surface 20a, and a support substrate 60 provided on the second electrode 40 side and supporting the stacked body 20 via a bonding metal 61.

The stacked body 20 includes a first semiconductor layer 21 of a first conductivity type, a second semiconductor layer 22 of a second conductivity type, and a light emitting portion 23 provided between the first semiconductor layer 21 and the second semiconductor layer 22. Furthermore, a protective film 80 is provided on the region from part of the first major surface 20a to the sidewall 20c of the stacked body 20.

The semiconductor light emitting element 190 according to the comparative example does not include the dielectric film 50. That is, on the second major surface 20b of the stacked body 20, the second electrode 40 is selectively provided. On the region of this second major surface 20b not provided with the second electrode 40, the first metal 611 of the bonding metal 61 is provided. Hence, before forming the protective film 80, the first metal 611 is exposed in the portion from which the stacked body 20 has been selectively removed.

If the first metal 611 is thus exposed, the first metal 611 may be partly peeled during the manufacturing process and turned into metal dust. Furthermore, if overetching occurs in selectively etching the stacked body 20, the surface of the first metal 611 is partly etched. Thus, the etched first metal 611 may be turned into metal dust. Metal dust causes leak current in the semiconductor light emitting element 190.

In contrast, in the semiconductor light emitting element 110 according to the first embodiment, a dielectric film 50 is provided between the first metal 611 and the region of the second major surface 20b not provided with the second electrode 40, and between the first metal 611 and the protective major surface 80a. The first metal 611 is covered with this dielectric film 50. Thus, the first metal 611 is not exposed even before forming the protective film 80. Furthermore, even if overetching occurs in selectively etching the stacked body 20, the dielectric film 50 serves as a stopper film. Thus, overetching to the first metal 611 is prevented, and the generation of metal dust resulting from the first metal 611 is suppressed.

Furthermore, in the semiconductor light emitting element 190 according to the comparative example, on the region of the second major surface 20b of the stacked body 20 not provided with the second electrode 40, the first metal 611 of the bonding metal 61 is provided. As described above, the first metal 611 is illustratively a multilayer metal film of Ti/Pt/Au. This multilayer metal film has a lower reflectance for emission light than the second electrode 40. Hence, the region of the second major surface 20b provided with the first metal 611 cannot sufficiently reflect emission light.

In contrast, in the semiconductor light emitting element 110 according to the first embodiment, the dielectric film 50 is provided on the region of the second major surface 20b not provided with the second electrode 40. The dielectric film 50 has a higher reflectance for emission light than the bonding metal 61. Hence, the second major surface 20b can sufficiently reflect emission light by the second electrode 40 and the dielectric film 50.

Second Embodiment

Next, an example method for manufacturing a semiconductor light emitting element according to a second embodiment is described.

The second embodiment relates to an example method for manufacturing the semiconductor light emitting element 110 described above.

FIGS. 5A to 7C are schematic cross-sectional views describing an example method for manufacturing a semiconductor light emitting element according to the second embodiment.

Figure 5A:
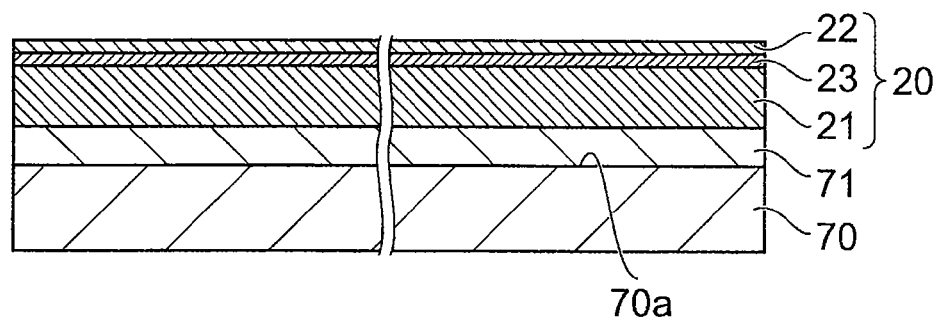
FIGS. 5A to 7C are schematic cross-sectional views describing an example method for manufacturing a semiconductor light emitting element according to a second embodiment.

First, as shown in FIG. 5A, a buffer layer 71 is formed on a major surface 70a of a growth substrate (first substrate) 70 illustratively made of sapphire. Then, a stacked body 20 including a first semiconductor layer 21, a light emitting portion 23, and a second semiconductor layer 22 is sequentially crystal grown thereon. The crystal growth of the stacked body 20 is performed by e.g. metal organic chemical vapor deposition (MOCVD). Alternatively, the crystal growth may be performed by molecular beam epitaxy (MBE). Here, besides sapphire, the growth substrate 70 can be made of any of various materials such as GaN, SiC, Si, and GaAs.

The first semiconductor layer 21 and the second semiconductor layer 22 illustratively include a nitride semiconductor made of InGaAlN. The first semiconductor layer 21 illustratively includes an n-type GaN contact layer. The second semiconductor layer 22 illustratively includes a p-type AlGaN layer, p-type Mg-doped GaN layer, and p-type GaN contact layer.

The light emitting portion 23 illustratively has a multiple quantum well (MQW) structure. That is, the light emitting portion 23 is formed by alternately and repeatedly stacking a plurality of barrier layers and a plurality of well layers.

Figure 5B:
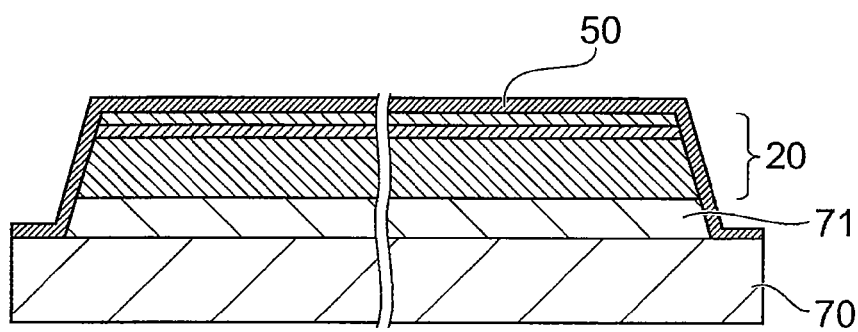

Next, as shown in FIG. 5B, dry etching is performed on a prescribed position of the stacked body 20 to form a mesa structure. This mesa structure reduces stress in the stacked body 20. Subsequently, a dielectric film 50 is formed on the stacked body 20. The dielectric film 50 is used as a stopper film in the etching of the stacked body 20 described later. Hence, the dielectric film 50 is made of a material providing a sufficient etching selection ration with respect to the stacked body 20.

Furthermore, the dielectric film 50 is used also as a reflective film for emission light. Hence, the dielectric film 50 is made of a material having a higher reflectance for emission light than the bonding metal 61 described later. The dielectric film 50 is illustratively made of silicon oxide, silicon nitride, and titanium oxide. The dielectric film 50 is a multilayer film in which a plurality of films of different refractive indices selected from these materials are stacked. Alternatively, the dielectric film 50 may be a single layer film made of one selected from the aforementioned materials. The dielectric film 50 is formed by e.g. sputtering or evaporation.

In the case where the dielectric film 50 is a single layer film, the film thickness d is configured to satisfy the aforementioned equation (1).

Figure 5C:
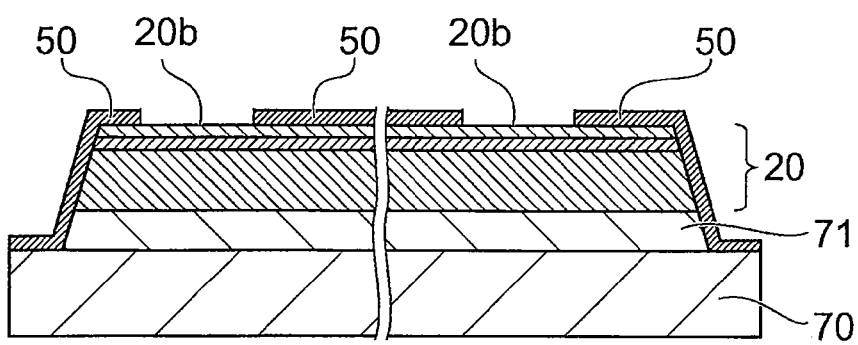

Next, as shown in FIG. 5C, the dielectric film 50 is selectively etched by e.g. photolithography to expose part of the second major surface 20b of the stacked body 20. The exposed portion of the second major surface 20b of the stacked body 20 is a portion to be brought into contact with the second electrode 40.

Figure 6A:
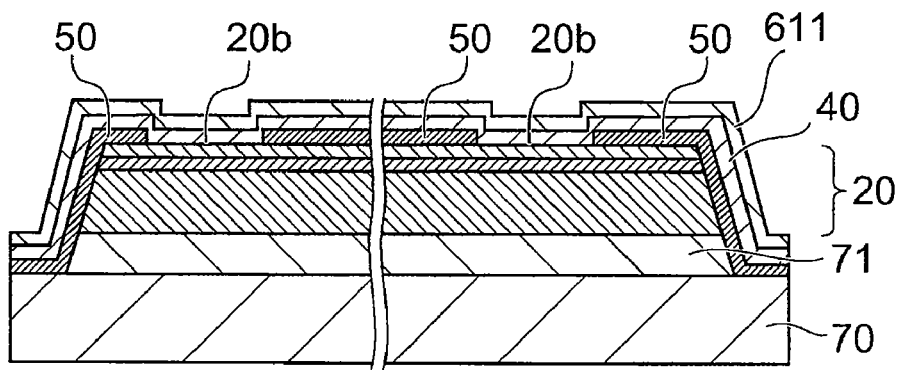

Next, as shown in FIG. 6A, a second electrode 40 is formed on the exposed portion of the second major surface 20b of the stacked body 20 and on the dielectric film 50. The second electrode 40 is illustratively a multilayer metal film of Ni/Ag. The film thickness of Ni is illustratively 1 nm. The film thickness of Ag is illustratively 200 nm. Here, these film thicknesses are illustrative only. Any thickness can be suitably used as long as sufficient reflectance and adhesion can be ensured. The second electrode 40 is formed by e.g. evaporation or sputtering. Here, after the second electrode 40 is formed on the entire surface, the second electrode 40 may be patterned as needed. In this example of the manufacturing method, the case of not patterning the second electrode 40 is described.

After the second electrode 40 is formed, a first metal 611 of the bonding metal 61 is formed on the second electrode 40. The first metal 611 is formed by e.g. evaporation or sputtering. The first metal 611 is illustratively a multilayer metal film of Ti/Pt/Au. The film thickness of Ti is illustratively 100 nm. The film thickness of Pt is illustratively 100 nm. The film thickness of Au is illustratively 400 nm. In the bonding metal 61, AuSn may be further formed on Au to form a multilayer metal film of Ti/Pt/Au/AuSn.

Figure 6B:
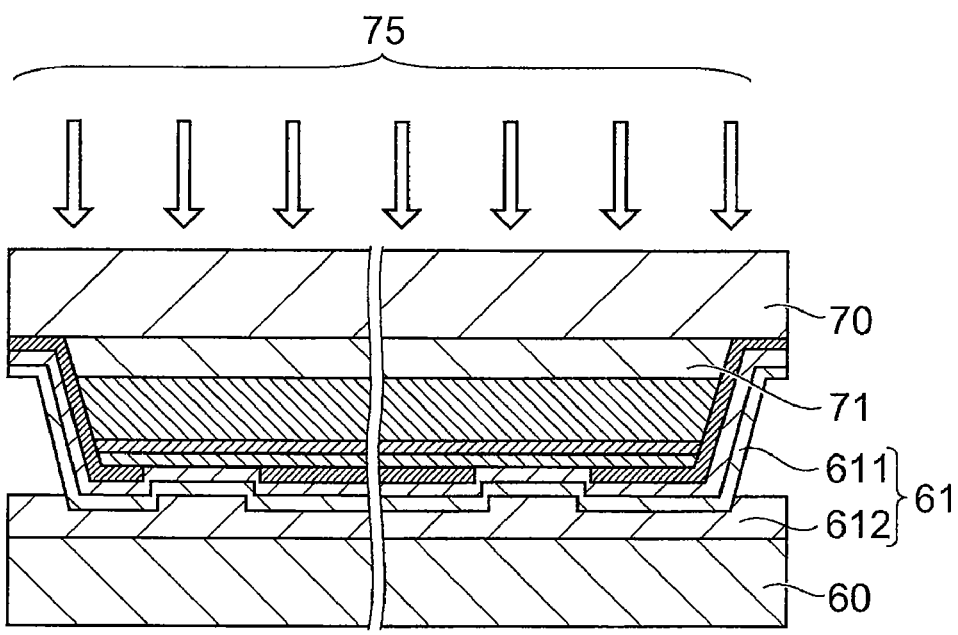

Next, as shown in FIG. 6B, a support substrate (second substrate) 60 with a second metal 612 formed thereon is prepared. The support substrate 60 is illustratively a silicon substrate with a surface orientation of (100). Here, it is also possible to use other surface orientations such as (111). The thickness of the support substrate 60 is illustratively 200 μm or more and 1 millimeter (mm) or less.

The second metal 612 is illustratively a multilayer metal film of Ti/Pt/Au/AuSn. The film thickness of Ti is illustratively 100 nm. The film thickness of Pt is illustratively 150 nm. The film thickness of Au is illustratively 400 nm. The film thickness of AuSn is illustratively 1.9 μm. The second metal 612 is formed by e.g. evaporation or sputtering on the support substrate 60.

Next, the second metal 612 formed on the support substrate 60 is laminated face-to-face with the first metal 611 previously manufactured on the growth substrate 70 side.

The first metal 611 and the second metal 612 are bonded together by e.g. loading and heating. More specifically, with the first metal 611 and the second metal 612 opposed to each other, a load of e.g. 5 kgf/cm² or more and 500 kgf/cm² or less is applied thereto, and they are heated to e.g. 200° C. or more and 400° C. or less. This causes interdiffusion between the first metal 611 and the second metal 612, which are thereby bonded together.

Next, the stacked body 20 is irradiated with laser light 75 from the growth substrate 70 side and subjected to laser lift-off.

The laser light 75 is produced using e.g. an excimer laser (KrF, 248 nm) or YAG laser. It is useful to match the one-spot diameter of the laser light 75 with the size of the mesa structure shown in FIG. 5B, for instance.

Figure 6C:
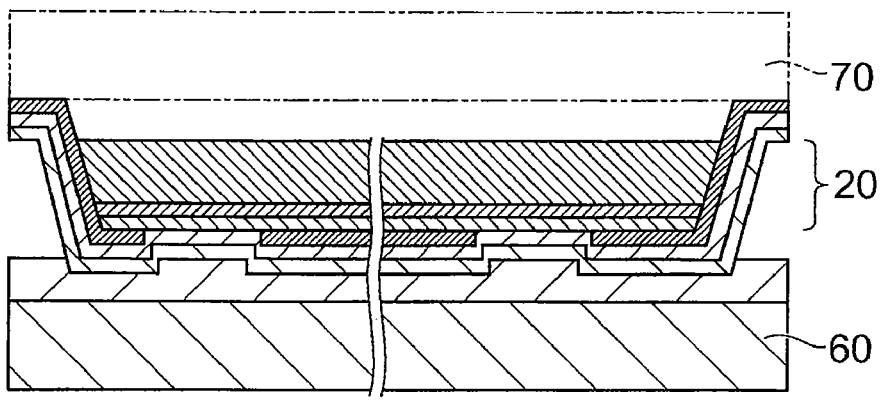

The laser light 75 is transmitted through the growth substrate 70 to the stacked body 20. Here, the buffer layer 71 located between the growth substrate 70 and the stacked body 20 absorbs the energy of laser light and is thermally decomposed. Consequently, as shown in FIG. 6C, the growth substrate 70 is peeled from the stacked body 20. The peeling may leave the part of the buffer layer 71 on the stacked body 20, in that case, the part of the buffer layer 71 can be removed by e.g. RIE (reactive ion etching).

Figure 7A:
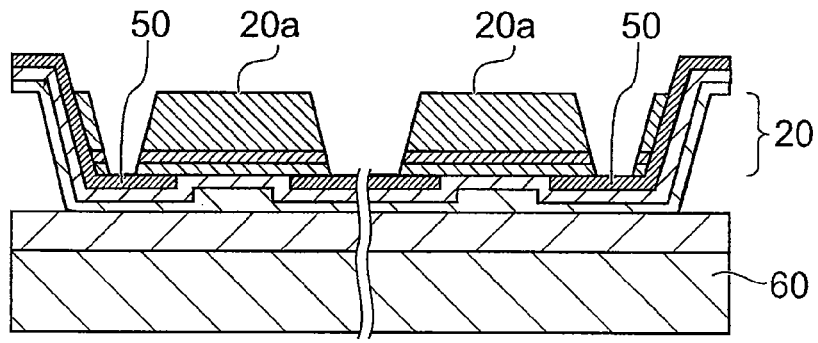

Next, as shown in FIG. 7A, the stacked body 20 is etched at the position of the chip boundary. The etching is performed by e.g. RIE (reactive ion etching) using chlorine-based gas. Here, FIG. 7A illustrates the etched state for division into two chips. The etching of the stacked body 20 gradually proceeds from the first major surface 20a. When the etching reaches the dielectric film 50, the dielectric film 50 serves as an etching stopper film. The dielectric film 50 has a sufficient etching selection ratio with respect to the stacked body 20. For instance, the stacked body 20 can be based on GaN, and the dielectric film 50 can be based on silicon oxide. In this case, the etching selection ratio of GaN to silicon oxide is 10. Thus, the dielectric film 50 functions as a stopper film in etching the stacked body 20.

Figure 7B:
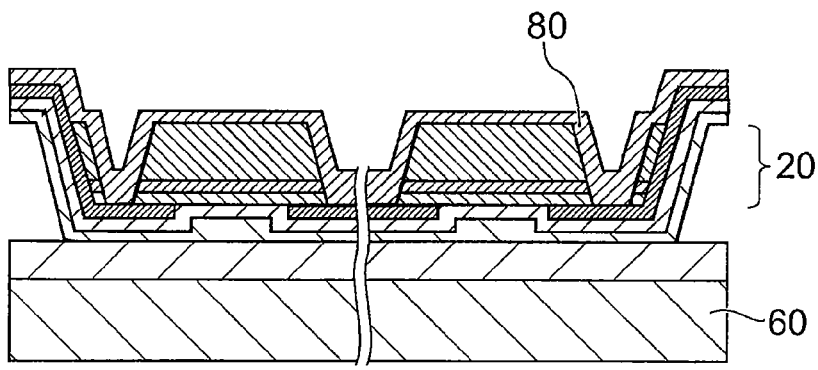

Next, as shown in FIG. 7B, a protective film 80 is formed. The protective film 80 serves to reduce leakage and to protect the element. The protective film 80 is formed by e.g. sputtering. The film thickness of the protective film 80 is illustratively 100 nm or more and 400 nm or less.

Figure 7C:
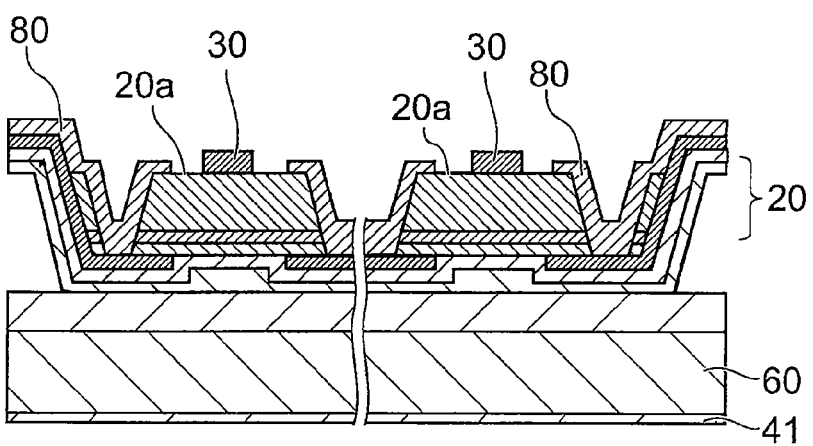

Next, as shown in FIG. 7C, the protective film 80 is selectively removed. More specifically, the protective film 80 on the first major surface 20a of the stacked body 20 is selectively etched and removed. Then, a first electrode 30 is formed on the first major surface 20a of the stacked body 20 exposed by the removal of the protective film 80. The first electrode 30 is illustratively a multilayer metal film of Ti/Pt/Au. The film thickness of Ti is illustratively 20 nm. The film thickness of Pt is illustratively 50 nm. The film thickness of Au is illustratively 700 nm. The first electrode 30 is formed by e.g. evaporation.

Furthermore, an electrode film 41 is formed on the support substrate 60. The electrode film 41 is illustratively a multilayer metal film of Ti/Pt/Au. The film thickness of Ti is illustratively 20 nm. The film thickness of Pt is illustratively 50 nm. The film thickness of Au is illustratively 700 nm. The electrode film 41 is formed by e.g. evaporation.

Subsequently, the stacked body 20 and the support substrate 60 are cut (diced) at the position of the chip boundary. Thus, the semiconductor light emitting element 110 shown in FIG. 1 is formed. In the manufacturing method as described above, peeling and etching of the bonding metal 61 can be prevented by the dielectric film 50. Hence, scattering of the bonding metal 61 into metal dust can be suppressed.

Manufacturing Method According to Comparative Example

FIGS. 8A to 10C are schematic views describing an example method for manufacturing a semiconductor light emitting element according to the comparative example.

Figure 8A:
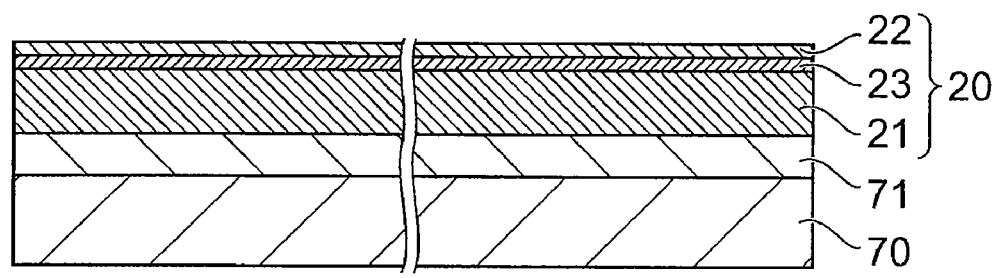
FIGS. 8A to 10C are schematic views describing an example method for manufacturing the semiconductor light emitting element according to the comparative example.

First, as shown in FIG. 8A, a buffer layer 71 is formed on a major surface 70a of a growth substrate 70 illustratively made of sapphire. Then, a stacked body 20 including a first semiconductor layer 21, a light emitting portion 23, and a second semiconductor layer 22 is crystal grown thereon.

Figure 8B:
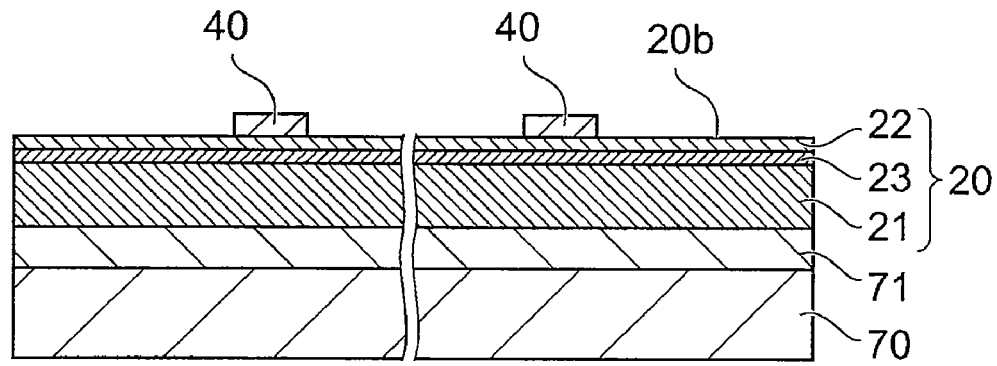
Figure 8C:
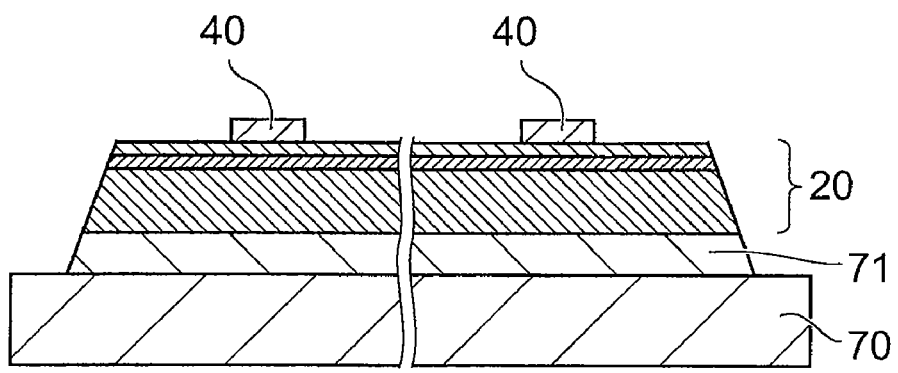

Next, as shown in FIG. 8B, a second electrode 40 is selectively formed on the second major surface 20b of the stacked body 20. Subsequently, as shown in FIG. 8C, dry etching is performed on a prescribed position of the stacked body 20 to form a mesa structure.

Figure 9A:
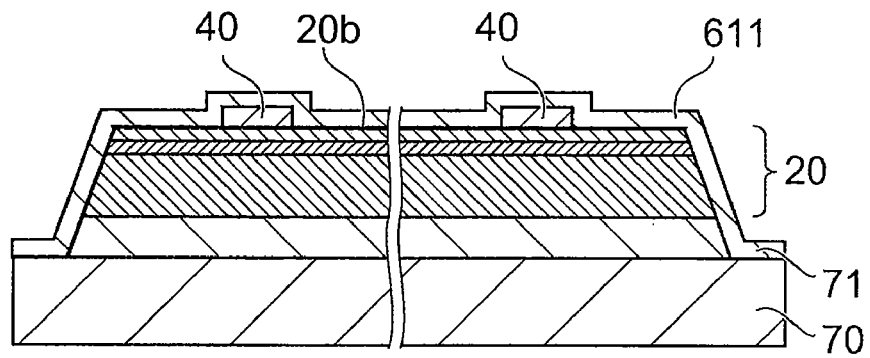
Figure 9B:
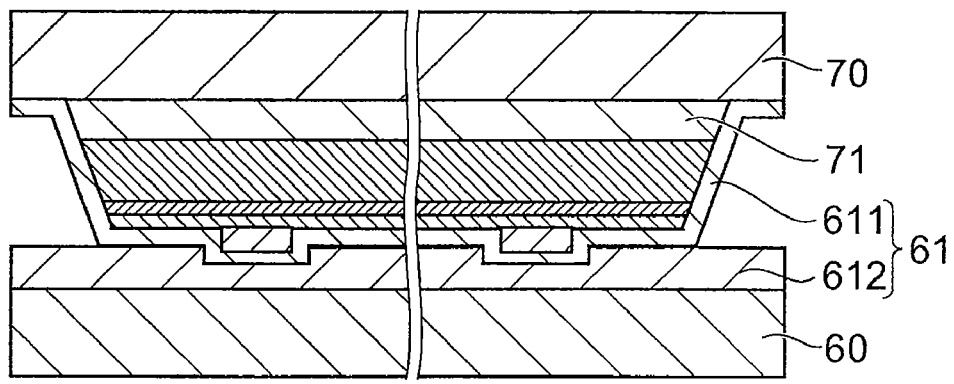

Next, as shown in FIG. 9A, a first metal 611 is formed so as to cover the second major surface 20b of the stacked body 20 and the second electrode 40. Subsequently, as shown in FIG. 9B, a support substrate 60 with a second metal 612 formed thereon is prepared. Then, the second metal 612 formed on the support substrate 60 is laminated face-to-face with the first metal 611 previously manufactured on the growth substrate 70 side.

Figure 9C:
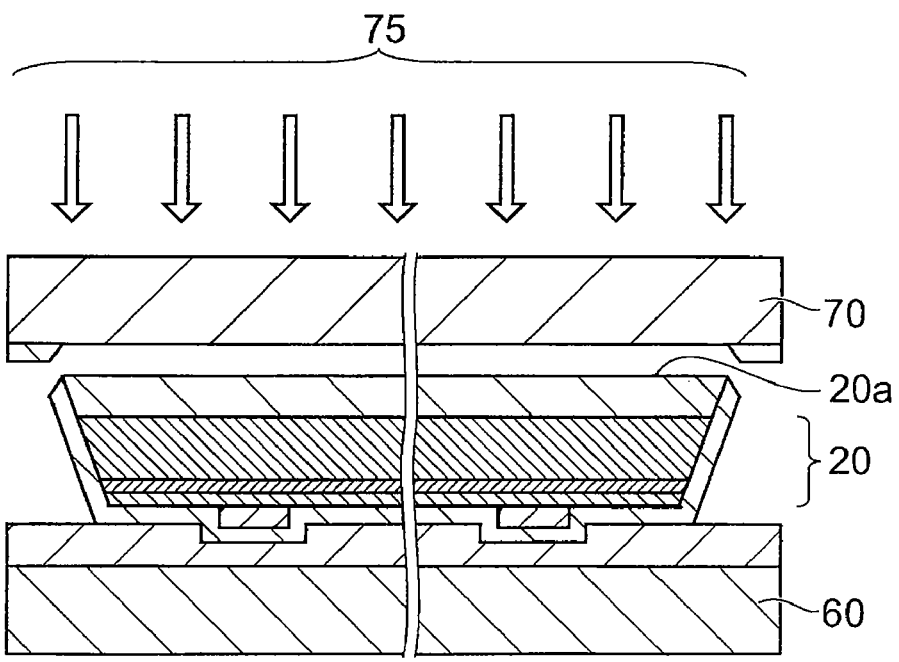

Next, as shown in FIG. 9C, the stacked body 20 is irradiated with laser light 75 from the growth substrate 70 side and subjected to laser lift-off. Thus, the growth substrate 70 is peeled from the first major surface 20a of the stacked body 20.

Figure 10A:
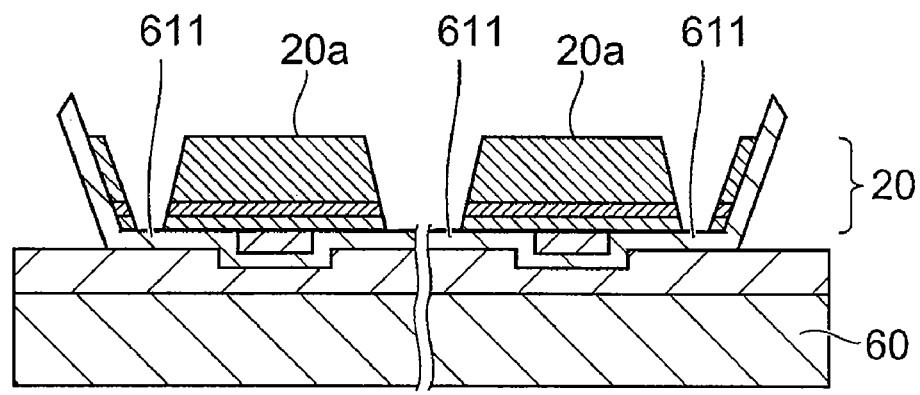

Next, as shown in FIG. 10A, the stacked body 20 is etched at the position of the chip boundary. The etching is performed by e.g. dry etching. Here, FIG. 10A illustrates the etched state for division into two chips. The stacked body 20 is etched from the first major surface 20a.

Figure 10B:
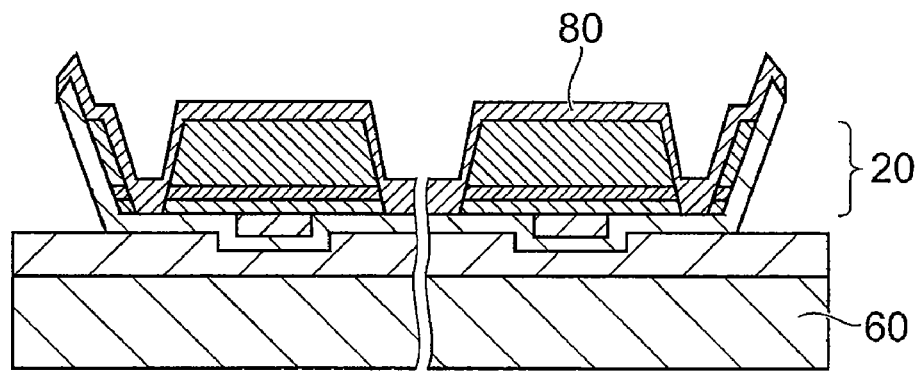

Next, as shown in FIG. 10B, a protective film 80 is formed.

Figure 10C:
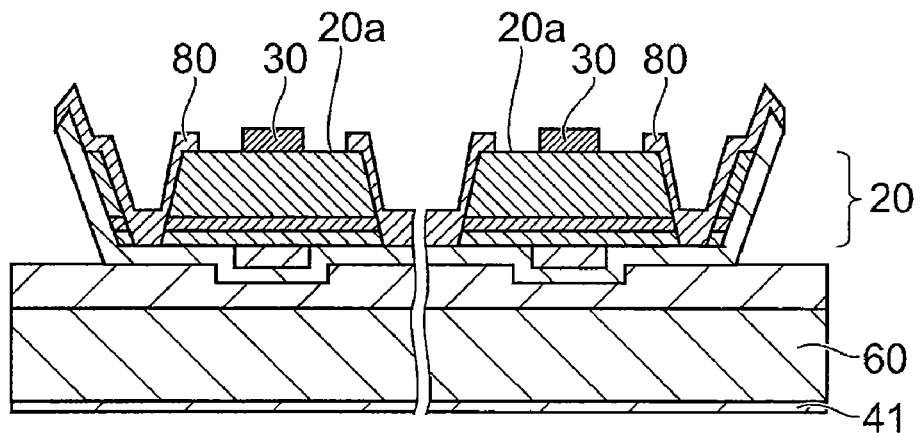

Subsequently, as shown in FIG. 10C, the protective film 80 is selectively removed. Then, a first electrode 30 is formed on the exposed first major surface 20a of the stacked body 20.

Subsequently, the stacked body 20 and the support substrate 60 are cut (diced) at the position of the chip boundary. Thus, the semiconductor light emitting element 190 according to the comparative example shown in FIG. 4 is formed.

In the method for manufacturing the semiconductor light emitting element 190 according to the comparative example, in the selective etching of the stacked body 20 shown in FIG. 10A, the first metal 611 is exposed to the etched portion. Thus, before the first metal 611 is covered with the protective film 80, the first metal 611 may be partly peeled. Furthermore, if overetching occurs in etching the stacked body 20, the first metal 611 is also etched. Thus, the etched first metal 611 may be scattered as metal dust. The peeled first metal 611 and the scattered first metal 611 act as metal dust, causing leak current in the semiconductor light emitting element 190.

In contrast, in the method for manufacturing the semiconductor light emitting element 110 according to this embodiment, a dielectric film 50 is provided between the first metal 611 and the stacked body 20. The first metal 611 is covered with this dielectric film 50. Thus, the first metal 611 is not exposed even before forming the protective film 80. Furthermore, even if overetching occurs in selectively etching the stacked body 20, the dielectric film 50 functions as a stopper film, and prevents the first metal 611 from being etched. Thus, scattering of the first metal 611 can be suppressed.

Third Embodiment

Figure 11:
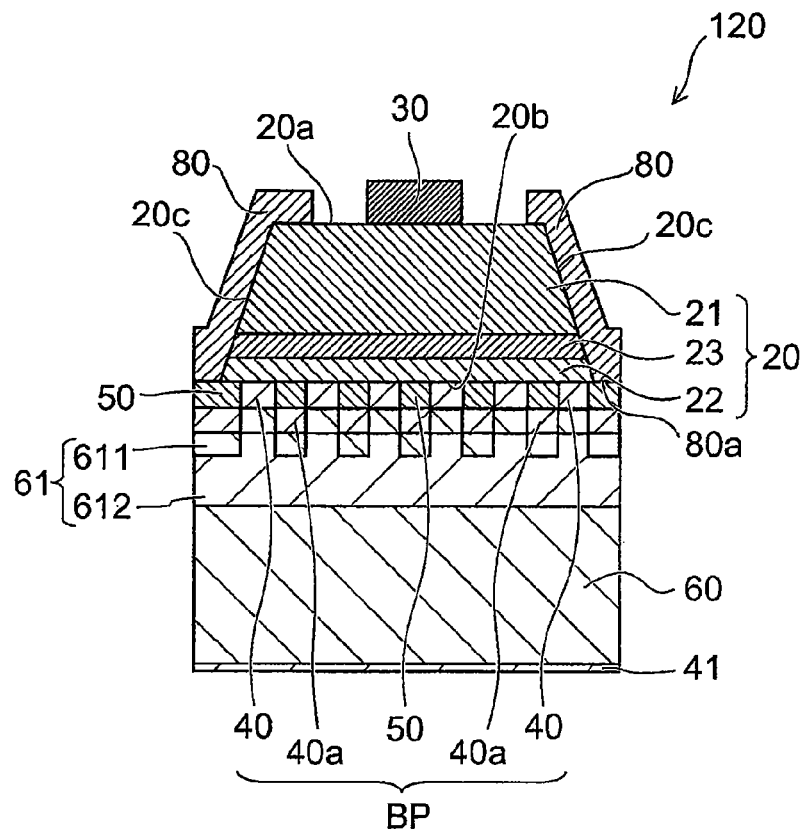
FIG. 11 is a schematic cross-sectional view illustrating a semiconductor light emitting element according to a third embodiment.

FIG. 11 is a schematic cross-sectional view illustrating a semiconductor light emitting element 120 according to a third embodiment.

Figure 12:
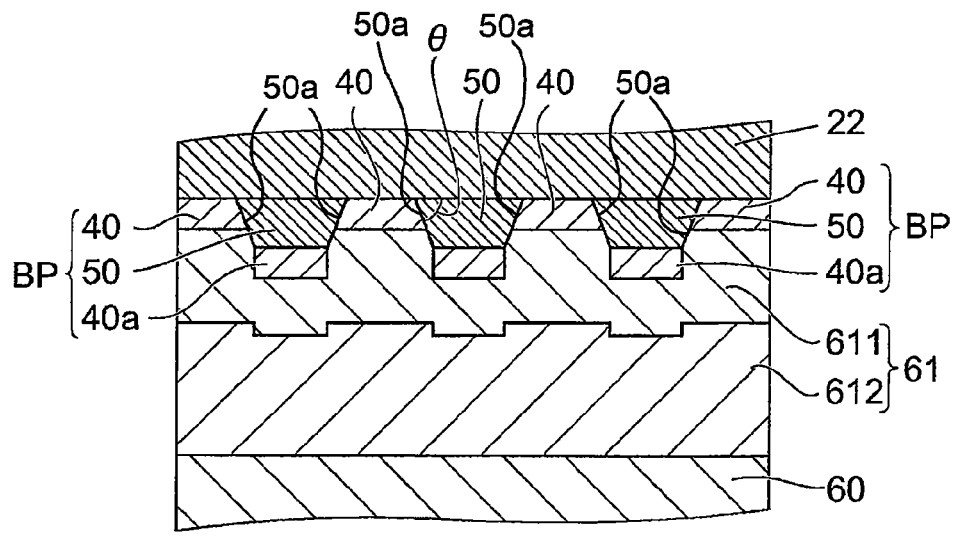
FIG. 12 is a schematic cross-sectional view illustrating the configuration of the second electrode and the dielectric film.

FIG. 12 is a schematic cross-sectional view illustrating the configuration of the second electrode and the dielectric film.

As shown in FIG. 11, the semiconductor light emitting element 120 according to the third embodiment includes a stacked body 20, a first electrode 30, a second electrode 40, a support substrate 60, a protective film 80, and a dielectric film 50.

The second electrode 40 and the dielectric film 50 are each provided in a plurality on the second major surface 20b of the stacked body 20. The plurality of second electrodes 40 and the plurality of dielectric films 50 are alternately arranged. Furthermore, a plurality of reflective films 40a are respectively provided on the opposite side of the plurality of dielectric films 50 from the second major surface 20b.

The semiconductor light emitting element 120 is illustratively an LED (light emitting diode).

The dielectric film 50 is illustratively made of silicon oxide, silicon nitride, and titanium oxide. The dielectric film 50 can be a single layer film made of one selected from these materials, or a multilayer film with a plurality of materials of different refractive indices used in combination.

The dielectric film 50 is provided between the first metal 611 and a region of the second major surface 20b not provided with the second electrode 40, and between the first metal 611 and the protective major surface 80a. Thus, the dielectric film 50 is used as a stopper film when the stacked body 20 is etched in the process for manufacturing the semiconductor light emitting element 120 described later. Furthermore, as necessary, the dielectric film 50 is used as a reflective film for reflecting light emitted from the light emitting portion 23.

As shown in FIG. 12, the semiconductor light emitting element 120 according to the third embodiment includes a bump/pit structure BP of a plurality of second electrodes 40 and a plurality of reflective films 40a with reference to the second major surface 20b of the stacked body 20. That is, the plurality of second electrodes 40 are provided in contact with the second major surface 20b, and the plurality of reflective films 40a are provided via the dielectric film 50 on the second major surface 20b. Hence, a step difference corresponding to the film thickness of the dielectric film 50 with reference to the second major surface 20b occurs between the plurality of second electrodes 40 and the plurality of reflective films 40a.

In the bump/pit structure BP, the step difference corresponding to the film thickness of the dielectric film 50 with reference to the second major surface 20b is repeated. The plurality of second electrodes 40 and the plurality of reflective films 40a are each provided in e.g. a striped configuration along the second major surface 20b. Alternatively, the plurality of second electrodes 40 and the plurality of reflective films 40a may be each provided in an island configuration along the second major surface 20b.

Here, the second electrode 40 is illustratively a multilayer metal film of Ni/Ag. In the second electrode 40, the multilayer metal film is stacked in the order of Ni/Ag on the second major surface 20b of the stacked body 20. The film thickness of the second electrode 40 is illustratively 200 nm.

The film thickness of the dielectric film 50 is illustratively less than 2 μm. The reflective film 40a is illustratively a multilayer metal film of Ni/Ag. In the reflective film 40a, the multilayer metal film is stacked in the order of Ni/Ag on the opposite side of the dielectric film 50 from the second major surface 20b. The film thickness of the reflective film 40a is illustratively 200 nm.

The reflective film 40a has a sufficient reflectance for emission light. The second electrode 40 also has a sufficient reflectance for emission light. Hence, the bump/pit structure BP is a light reflecting structure capable of sufficiently reflecting emission light. The material of the reflective film 40a may be either the same as or different from the material of the second electrode 40. If the material of the reflective film 40a is the same as the material of the second electrode 40, it is easier to manufacture both of them in the same process.

In the semiconductor light emitting element 120 according to the third embodiment, the bump/pit structure BP is provided on the second major surface 20b side of the stacked body 20. Part of the emission light emitted from the light emitting portion 23 is directed toward the bump/pit structure BP, and diffused by the bump/pit structure BP. Thus, the angle of light returned to the light emitting portion 23 is dispersed, thereby increasing the light emission efficiency.

From the viewpoint of reflecting emission light, the dielectric film 50 may have an inclined surface 50a with respect to the second major surface 20b. The inclined surface 50a of the dielectric film 50 is in contact with the side surface of the second electrode 40. Hence, if the inclined surface 50a makes an angle θ with the second major surface 20b, the angle of the side surface of the second electrode 40 is the supplementary angle, 180°−θ. The light reflection characteristics at the bump/pit structure BP vary with the setting of the angle θ.

Fourth Embodiment

Next, an example method for manufacturing a semiconductor light emitting element according to a fourth embodiment is described.

The fourth embodiment relates to an example method for manufacturing the semiconductor light emitting element 120 described above.

FIGS. 13A to 15C are schematic cross-sectional views describing an example method for manufacturing a semiconductor light emitting element according to the fourth embodiment.

Figure 13A:
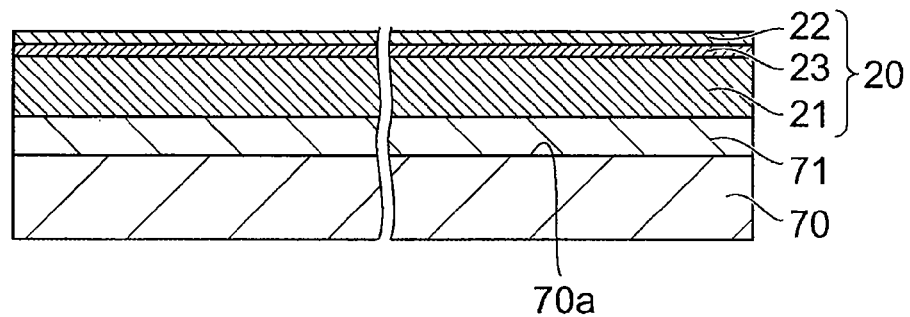
FIGS. 13A to 15C are schematic cross-sectional views describing an example method for manufacturing a semiconductor light emitting element according to a fourth embodiment.

First, as shown in FIG. 13A, a buffer layer 71 is formed on a major surface 70a of a growth substrate 70 illustratively made of sapphire. Then, a stacked body 20 including a first semiconductor layer 21, a light emitting portion 23, and a second semiconductor layer 22 is crystal grown thereon. The crystal growth is performed by e.g. MOCVD. Alternatively, the crystal growth may be performed by MBE. Here, besides sapphire, the growth substrate 70 can be made of any of various materials such as GaN, SiC, Si, and GaAs.

The first semiconductor layer 21 and the second semiconductor layer 22 illustratively include a nitride semiconductor. The first semiconductor layer 21 illustratively includes an n-type GaN contact layer. The second semiconductor layer 22 illustratively includes a p-type AlGaN layer, p-type Mg-doped GaN layer, and p-type GaN contact layer. The light emitting portion 23 illustratively has an MQW structure. That is, the light emitting portion 23 is formed by alternately and repeatedly stacking a plurality of barrier layers and a plurality of well layers.

Figure 13B:
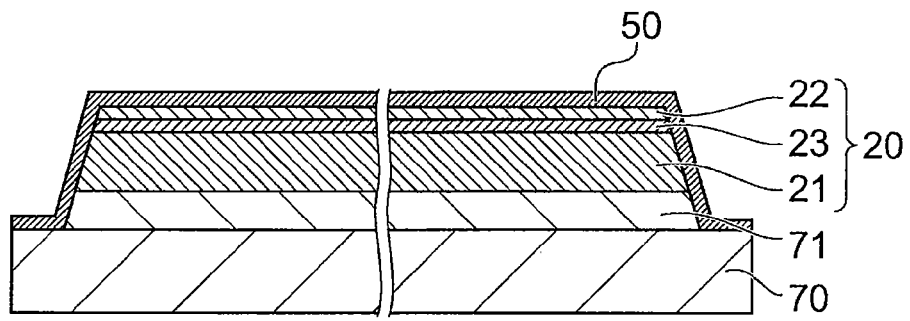

Next, as shown in FIG. 13B, dry etching is performed on a prescribed position of the stacked body 20 to form a mesa structure. This mesa structure reduces stress in the stacked body 20. Subsequently, a dielectric film 50 is formed on the stacked body 20. The dielectric film 50 is used as a stopper film in the etching of the stacked body 20 described later. Hence, the dielectric film 50 is made of a material providing a sufficient etching selection ration with respect to the stacked body 20.

The dielectric film 50 is illustratively made of silicon oxide, silicon nitride, and titanium oxide. The dielectric film 50 is a multilayer film in which different types of materials selected from these materials are combined. Alternatively, the dielectric film 50 may be a single layer film made of one selected from the aforementioned materials. The dielectric film 50 is formed by e.g. sputtering or evaporation.

Figure 13C:
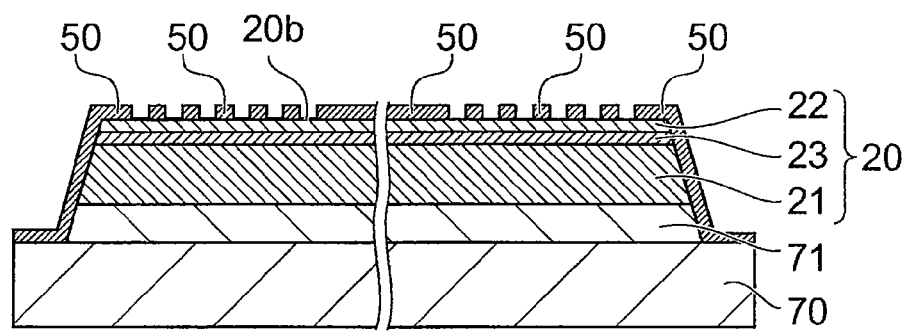

Next, as shown in FIG. 13C, the dielectric film 50 is selectively etched by e.g. photolithography to expose part of the second major surface 20b of the stacked body 20. The exposed portion of the second major surface 20b of the stacked body 20 is a portion to be brought into contact with the second electrode 40. Here, the dielectric film 50 is etched in accordance with the positions of a plurality of second electrodes 40 in the bump/pit structure BP.

Figure 14A:
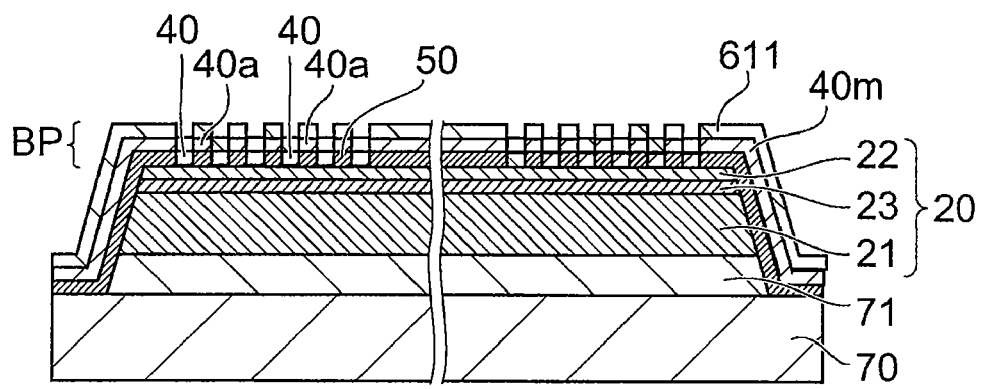

Next, as shown in FIG. 14A, a reflective metal film 40m is formed on the exposed portion of the second major surface 20b of the stacked body 20 and on the dielectric film 50. The reflective metal film 40m is illustratively a multilayer metal film of Ni/Ag. The film thickness of Ni is illustratively 1 nm. The film thickness of Ag is illustratively 200 nm. Here, these film thicknesses are illustrative only. Any thickness can be suitably used as long as sufficient reflectance and adhesion can be ensured. The reflective metal film 40m is formed by e.g. evaporation or sputtering.

Here, the reflective metal film 40m formed on the exposed portion of the second major surface 20b of the stacked body 20 constitutes a second electrode 40. The reflective metal film 40m formed on the dielectric film 50 constitutes a reflective film 40a. That is, the second electrode 40 and the reflective film 40a are formed in the same process by forming the reflective metal film 40m.

After the second electrode 40 and the reflective film 40a are formed, a first metal 611 of the bonding metal 61 is formed thereon. The first metal 611 is formed by e.g. evaporation or sputtering. The first metal 611 is illustratively a multilayer metal film of Ti/Pt/Au. The film thickness of Ti is illustratively 100 nm. The film thickness of Pt is illustratively 100 nm. The film thickness of Au is illustratively 400 nm. In the bonding metal 61, AuSn may be further formed on Au to form a multilayer metal film of Ti/Pt/Au/AuSn.

The first metal 611 is configured in correspondence with the bump/pit configuration of the bump/pit structure BP.

Figure 14B:
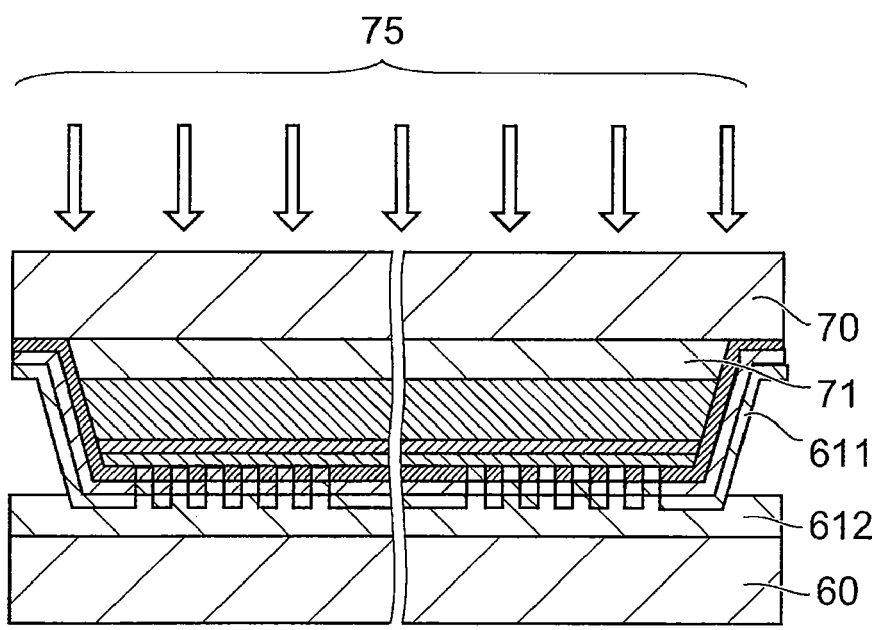

Next, as shown in FIG. 14B, a support substrate 60 with a second metal 612 formed thereon is prepared. The support substrate 60 is illustratively a silicon substrate with a surface orientation of (100). Here, it is also possible to use other surface orientations such as (111). The thickness of the support substrate 60 is illustratively 200 μm or more and 1 millimeter (mm) or less.

The second metal 612 is illustratively a multilayer metal film of Ti/Pt/Au/AuSn. The film thickness of Ti is illustratively 100 nm. The film thickness of Pt is illustratively 150 nm. The film thickness of Au is illustratively 400 nm. The film thickness of AuSn is illustratively 1.9 μm. The second metal 612 is formed by e.g. evaporation or sputtering on the support substrate 60.

Next, the second metal 612 formed on the support substrate 60 is laminated face-to-face with the first metal 611 previously manufactured on the growth substrate 70 side.

The first metal 611 and the second metal 612 are bonded together by e.g. loading and heating. More specifically, with the first metal 611 and the second metal 612 opposed to each other, a load of e.g. 5 kgf/cm² or more and 500 kgf/cm² or less is applied thereto, and they are heated to e.g. 200° C. or more and 400° C. or less. This causes interdiffusion between the first metal 611 and the second metal 612, which are thereby bonded together.

Because the first metal 611 is configured in correspondence with the bump/pit configuration of the bump/pit structure BP, the bonding strength between the first metal 611 and the second metal 612 is higher than in the case of the flat configuration.

Next, the stacked body 20 is irradiated with laser light 75 from the growth substrate 70 side and subjected to laser lift-off. The laser light 75 is produced using e.g. an excimer laser (KrF, 248 nm) or YAG laser. It is useful to match the one-spot diameter of the laser light 75 with the size of the mesa structure shown in FIG. 13B, for instance.

Figure 14C:
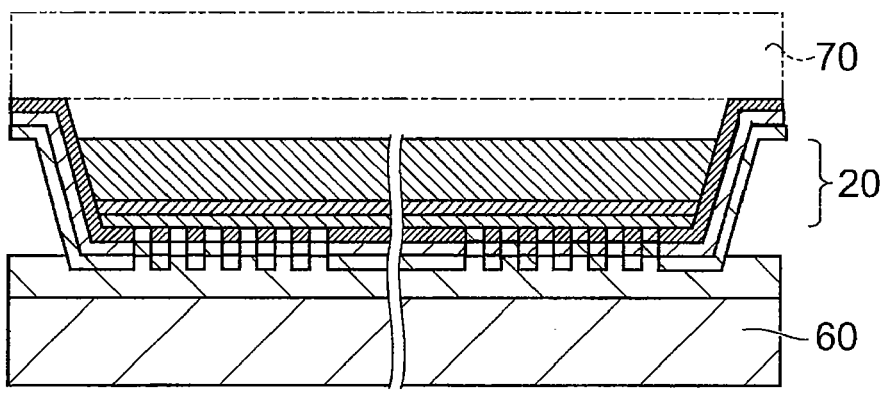

The laser light 75 is transmitted through the growth substrate 70 to the stacked body 20. Here, the buffer layer 71 located between the growth substrate 70 and the stacked body 20 absorbs the energy of laser light and is thermally decomposed. Consequently, as shown in FIG. 14C, the growth substrate 70 is peeled from the stacked body 20.

Figure 15A:
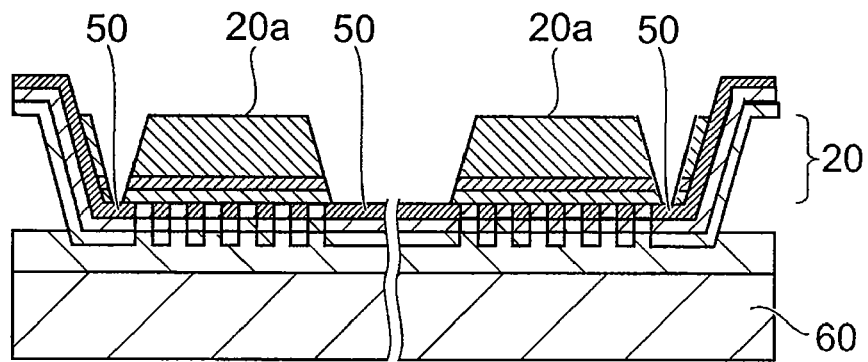

Next, as shown in FIG. 15A, the stacked body 20 is etched at the position of the chip boundary. The etching is performed by e.g. RIE using chlorine-based gas. Here, FIG. 15A illustrates the etched state for division into two chips. The etching of the stacked body 20 gradually proceeds from the first major surface 20a. When the etching reaches the dielectric film 50, the dielectric film 50 serves as an etching stopper. The dielectric film 50 has a sufficient etching selection ratio with respect to the stacked body 20. For instance, the stacked body 20 can be based on GaN, and the dielectric film 50 can be based on silicon oxide. In this case, the etching selection ratio of GaN to silicon oxide is 10. Thus, the dielectric film 50 functions as a stopper film in etching the stacked body 20.

Figure 15B:
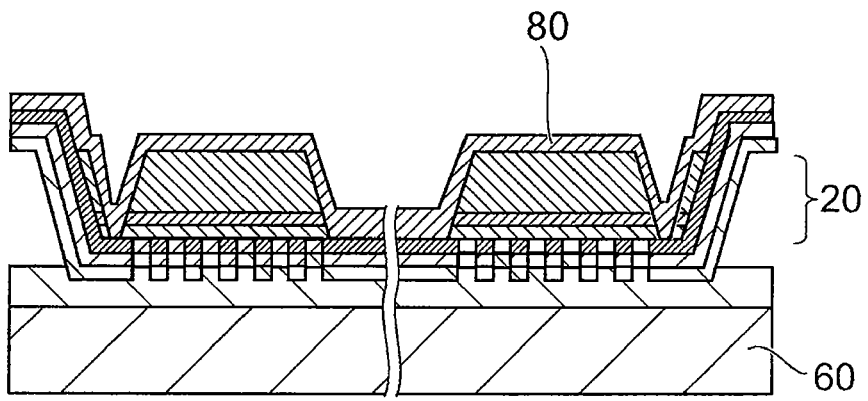

Next, as shown in FIG. 15B, a protective film 80 is formed. The protective film 80 serves to reduce leakage and to protect the element. The protective film 80 is formed by e.g. sputtering. The film thickness of the protective film 80 is illustratively 100 nm or more and 400 nm or less.

Figure 15C:
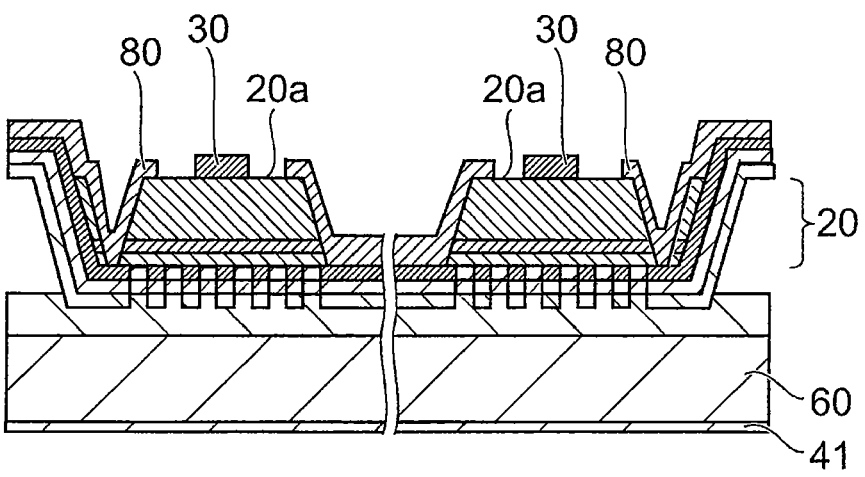

Next, as shown in FIG. 15C, the protective film 80 is selectively removed. More specifically, the protective film 80 on the first major surface 20a of the stacked body 20 is selectively etched and removed. Then, a first electrode 30 is formed on the first major surface 20a of the stacked body 20 exposed by the removal of the protective film 80. The first electrode 30 is illustratively a multilayer metal film of Ti/Pt/Au. The film thickness of Ti is illustratively 20 nm. The film thickness of Pt is illustratively 50 nm. The film thickness of Au is illustratively 700 nm. The first electrode 30 is formed by e.g. evaporation.

Furthermore, an electrode film 41 is formed on the support substrate 60. The electrode film 41 is illustratively a multilayer metal film of Ti/Pt/Au. The film thickness of Ti is illustratively 20 nm. The film thickness of Pt is illustratively 50 nm. The film thickness of Au is illustratively 700 nm. The electrode film 41 is formed by e.g. evaporation.

Subsequently, the stacked body 20 and the support substrate 60 are cut (diced) at the position of the chip boundary. Thus, the semiconductor light emitting element 120 shown in FIG. 11 is formed. In the manufacturing method as described above, peeling and etching of the bonding metal 61 can be prevented by the dielectric film 50. Hence, scattering of the bonding metal 61 into metal dust can be suppressed.

The embodiments of the invention and the variations thereof have been described. However, the invention is not limited to these examples. For instance, in the embodiments and variations described above, the first conductivity type is n-type, and the second conductivity type is p-type. However, the invention is also applicable to the case where the first conductivity type is p-type, and the second conductivity type is n-type.

Furthermore, for instance, an electronic circuit capable of processing light signals emitted from the semiconductor light emitting element 110 can be integrated on the same support substrate 60 to form an optoelectronic integrated circuit. Such an optoelectronic integrated circuit is also encompassed in the present embodiments.

Furthermore, the components of the above embodiments can be combined with each other as long as technically feasible, and such combinations are also encompassed within the scope of the invention as long as they include the features of the invention.

Furthermore, those skilled in the art can conceive various modifications and variations within the spirit of the invention, and it is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor light emitting element comprising:
a stacked body including a first semiconductor layer of a first conductivity type, a second semiconductor layer of a second conductivity type opposite to the first conductivity type, and a light emitting portion provided between the first semiconductor layer and the second semiconductor layer, the stacked body having a side surface which is formed by etching;
a first electrode provided on a side of a first surface of the stacked body;
a plurality of second electrodes selectively provided on a side of a second surface of the stacked body, the second surface being on an opposite side from the first surface;
a support substrate provided on the side of the second surface of the stacked body via a bonding metal;
a protective film provided on the side surface of the stacked body, and not on the second surface of the stacked body; and
a dielectric film having a portion provided between the bonding metal and the second surface of the stacked body, and another portion provided between the bonding metal and the protective film, the dielectric film surrounding the plurality of second electrodes and having a film thickness that is larger than a film thickness of the second electrodes.

2. The element according to claim 1, wherein the dielectric film includes a multilayer film with a plurality of films of different refractive indexes stacked in the dielectric film.

3. The element according to claim 1, wherein reflectance of the dielectric film for light emitted from the light emitting portion is higher than reflectance of the bonding metal for the light emitted from the light emitting portion.

4. The element according to claim 1, wherein the dielectric film is a single layer film.

5. The element according to claim 1, wherein the second electrode is formed on a region of the second surface side of the stacked body.

6. The element according to claim 1, wherein the bonding metal includes a first metal provided on the second electrode side and a second metal provided on the support substrate side.

7. The element according to claim 6, wherein the first metal is a multilayer metal film.

8. The element according to claim 6, wherein the first metal is a multilayer metal film stacked in order of Ti/Pt/Au from the second electrode side.

9. The element according to claim 6, wherein the second metal is a multilayer metal film.

10. The element according to claim 6, wherein the second metal is a multilayer metal film stacked in order of Ti/Pt/Au/AuSn from the support substrate side.

11. The element according to claim 1, wherein
on the second surface, the dielectric film is provided as a plurality of dielectric film portions, and the plurality of dielectric film portions and the plurality of second electrodes are alternately arranged, and a plurality of reflective films are each provided on one of the plurality of dielectric film portions on a side of the dielectric film portion that is opposite the side of the second surface.

12. The element according to claim 11, wherein each of the plurality of second electrodes and each of the plurality of reflective films are provided in a striped configuration along the second surface.

13. The element according to claim 1, further comprising:
a plurality of reflective films which is in contact with the dielectric film on a side of the bonding metal.

14. The element according to claim 11, wherein each of the dielectric film portions has an inclined surface with respect to the second surface.

15. A method for manufacturing a semiconductor light emitting element, comprising:
forming a stacked body including a first semiconductor layer of a first conductivity type, a light emitting portion, and a second semiconductor layer of a second conductivity type on a first substrate;
forming a dielectric film on a second surface of the stacked body on an opposite side from the first substrate;
exposing a part of the second surface of the stacked body by selectively removing the dielectric film, and forming a second electrode on the part of the second surface;
forming a reflective film on the dielectric film;
forming a metal layer on the second electrode to bond a second substrate via the metal layer;
peeling the first substrate from the stacked body by irradiating the first substrate with laser light on a side of the first substrate opposite to the second substrate;
selectively removing the stacked body by etching the stacked body from a side of the stacked body that is opposite the second surface, using the dielectric film as an etch stopper; and
forming a first electrode on the first surface.

16. The method according to claim 15, wherein a bump/pit structure is provided by selectively removing the dielectric film.

17. The method according to claim 15, wherein the dielectric film includes a multilayer film with a plurality of films of different refractive indices stacked in the dielectric film.

18. The method according to claim 15, wherein
reflectance of the dielectric film for light emitted from the light emitting portion is higher than reflectance of the metal layer for the light emitted from the light emitting portion.

19. The element according to claim 13, wherein the reflective film is a multilayer metal film containing at least Ag.

* * * * *